United States Patent
Lo

(10) Patent No.: US 10,339,991 B2
(45) Date of Patent: Jul. 2, 2019

(54) MEMORY SYSTEM HAVING OPTIMAL THRESHOLD VOLTAGE AND OPERATING METHOD THEREOF

(71) Applicant: SK hynix Inc., Gyeonggi-do OT (KR)

(72) Inventor: Yungcheng Lo, Cupertino, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/595,664

(22) Filed: May 15, 2017

(65) Prior Publication Data

US 2017/0330607 A1  Nov. 16, 2017

Related U.S. Application Data

(60) Provisional application No. 62/337,134, filed on May 16, 2016.

(51) Int. Cl.

| | |
|---|---|
| G06F 11/10 | (2006.01) |
| G11C 8/12 | (2006.01) |
| G06F 11/16 | (2006.01) |
| G06F 11/30 | (2006.01) |
| G11C 16/26 | (2006.01) |
| G11C 16/04 | (2006.01) |
| G06F 11/14 | (2006.01) |
| G11C 16/34 | (2006.01) |
| G11C 29/00 | (2006.01) |
| G11C 29/02 | (2006.01) |
| G11C 29/42 | (2006.01) |

(Continued)

(52) U.S. Cl.
CPC .......... *G11C 8/12* (2013.01); *G06F 11/1012* (2013.01); *G06F 11/141* (2013.01); *G06F 11/1666* (2013.01); *G06F 11/30* (2013.01); *G11C 16/04* (2013.01); *G11C 16/26* (2013.01); *G11C 16/34* (2013.01); *G11C 29/00* (2013.01); *G11C 29/028* (2013.01); *G11C 29/42* (2013.01); *G11C 29/50004* (2013.01); *G11C 29/52* (2013.01); *G11C 16/349* (2013.01); *G11C 2211/563* (2013.01)

(58) Field of Classification Search
CPC .... G06F 11/141; G06F 11/10; G06F 11/1012; G11C 16/26; G11C 16/34; G11C 16/04
See application file for complete search history.

(56) References Cited

U.S. PATENT DOCUMENTS

| 8,732,392 B2 | 5/2014 | Byom et al. |
| 8,837,263 B1 | 9/2014 | Cao et al. |

(Continued)

*Primary Examiner* — Hoai V Ho
*Assistant Examiner* — Jay W. Radke
(74) *Attorney, Agent, or Firm* — IP & T Group LLP

(57) ABSTRACT

A semiconductor memory system and an operating method thereof include a memory device; and a memory controller including a sequence generator, a sequence analyzer, and a processor coupled to the memory device and containing instructions executed by the processor, and configured to generate a sequence by the sequence generator, wherein the sequence comprises a sequence of digital data, write the sequence associated with a user data to the memory device, read out a read data including the sequence and the associated user data, analyze the sequence to understand characters of the read data and create analysis result by the sequence analyzer, identify an optimal threshold voltage in accordance with the analysis result, and provide the optimal threshold voltage to an ECC engine.

20 Claims, 7 Drawing Sheets

(51) Int. Cl.
    *G11C 29/50*       (2006.01)
    *G11C 29/52*       (2006.01)

(56) References Cited

U.S. PATENT DOCUMENTS

| | | | | |
|---|---|---|---|---|
| 9,086,982 B1* | 7/2015 | Xu | ............... | G06F 11/0751 |
| 2009/0323942 A1* | 12/2009 | Sharon | ............... | G11C 7/1006 |
| | | | | 380/44 |
| 2014/0143637 A1* | 5/2014 | Cohen | ............... | H03M 13/1108 |
| | | | | 714/773 |

* cited by examiner

MEMORY SYSTEM HAVING OPTIMAL THRESHOLD VOLTAGE AND OPERATING METHOD THEREOF

CROSS REFERENCE TO OTHER APPLICATIONS

This application claims priority to U.S. Provisional Patent Application No. 62/337,134 entitled TRAINING SEQUENCE WITH USER DATA filed May 16, 2016, which is incorporated herein by reference for all purposes.

BACKGROUND

1. Field

Exemplary embodiments of the present disclosure relate to a memory system, and more particularly to a semiconductor memory system having an optimal threshold voltage and operating method thereof.

2. Description of the Related Art

The use of computer systems and portable electronic devices has been rapidly increased in the digital era. The memory system, such as NAND flash memory, as well as other types of non-volatile memories, are commonly used as mass storage in the electronic devices. Due to this fact, the reliability of digital data storage is critical.

To ensure the digital data is reliably protected, the non-volatile memories often need robust error correction modules and operating method thereof. The most common error correction modules and operating method thereof currently utilized are classical Error Correction Codes (ECCs) or Low-Density Parity Check (LDPC) codes.

The error correction modules and operating method thereof cannot function properly without an appropriate threshold voltage (Vt) to distinguish 0s and 1s. The error correction operation can fail if the appropriate threshold voltage is not properly identified.

Thus, there remains a need for a memory system having an optimal threshold voltage and operating method thereof. In view of the ever-increasing need to improve performance and reliability, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a memory system having an optimal threshold voltage and operating method thereof capable of improving the performance and reliability of the memory system.

A method of operating a semiconductor memory system comprises generating a sequence by a sequence generator, wherein the sequence comprises a sequence of digital data, writing the sequence associated with a user data to a memory device, reading out read data including the sequence and the associated user data, analyzing the sequence to understand characters of the read data and creating analysis result by a sequence analyzer, identifying an optimal threshold voltage in accordance with the analysis result, and providing the optimal threshold voltage to an ECC engine.

A semiconductor memory system comprises a memory device; and a memory controller including a sequence generator, a sequence analyzer, and a processor coupled to the memory device and containing instructions executed by the processor, and configured to generate a sequence by the sequence generator, wherein the sequence comprises a sequence of digital data, write the sequence associated with a user data to the memory device, read out a read data including the sequence and the associated user data, analyze the sequence to understand characters of the read data and create analysis result by the sequence analyzer, identify an optimal threshold voltage in accordance with the analysis result, and provide the optimal threshold voltage to an ECC engine.

DETAILED DESCRIPTION

Figure 1:
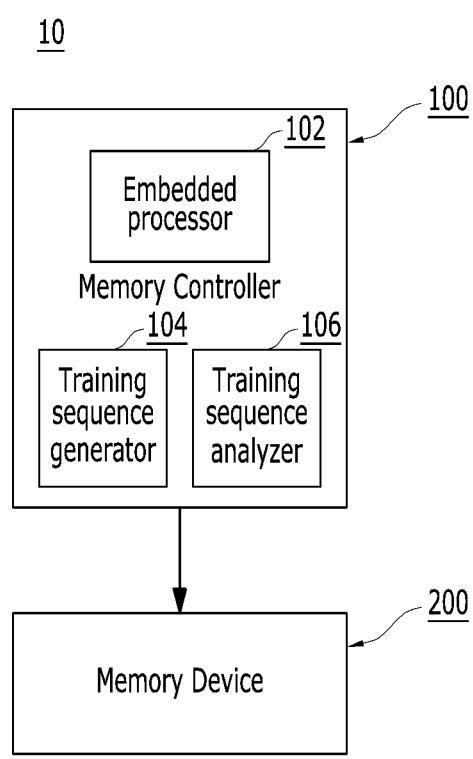
FIG. 1 is a top-level block diagram schematically illustrating a semiconductor memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various drawings and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying drawings that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Currently, in a memory system, a memory controller can control read operations to read out user data from memory devices, such as non-volatile memories. The memory controller can send read request to the memory devices. The memory devices can fetch/read the user data requested in accordance with the read request. The fetched/read user data then can be sent to an ECC encoder for error correction operation, and a cyclic redundancy check (CRC) can be inserted to improve data reliability. Extra bits, such as parity bits can be added to make sure the user data can be recovered through ECC decoder or request re-read in case errors are detected.

The user data can be protected and recovered by the ECC. The ECC can be implemented by powerful code, such as LDPC, Turbo Product Code (TPC), or other turbo codes. However, without obtaining proper levels of thresholds voltage Vt, these powerful ECC engine may be unable to recover the user data or even waste a lot of time to process wrong sliced data. Even the user data finally can be decoded, the performance of the memory system can be degraded. So, the keys to recover the user data may not be how powerful the ECC is design, instead, could be how smart the signal process mechanism/algorithm is utilized.

The ECC engine including the ECC encoder and ECC decoder may fail if the levels of threshold Vt are improperly identified to distinguish 0s and 1s. The number of the threshold voltages may be various in accordance to the memory cell types, such that multiple threshold voltages may be needed to identify for multi-level memory cells (MLC), while single threshold voltage may be needed for single-level memory cells (SLC). The memory cells may also include triple-level memory cells (TLC) having corresponding multiple threshold voltages. Thus, optimal threshold voltages Vt can be critical in the memory system.

The levels of optimal thresholds Vt can be obtained via a table through the pre-process from Nand characterization study during Nand manufacture. However, the levels of optimal thresholds Vt are usually un-predictable and can be based upon various factors, such as quality control of Nand manufacture, aging of the Nand, retention of data, temperature of the operation, and the usage of the Nand.

History of the operation or usage can be stored in a history table. The history table may help to identify the optimal threshold voltage Vt but may not be necessarily helpful, and the cost of storing and managing the history table is high. Although some digital signal process (DSP) algorithms like re-retry and eBoost can be utilized to search the optimal threshold voltages Vt, the searching process is time consuming and costly.

Since the operation conditions can be various and unpredictable, characters of read data to be read out from the memory devices can also be various and unpredictable. Instead of guessing with tries and errors, the characters of read data can be understood by analyzing the read data. A known sequence, such as a training sequence, can be introduced into the analyzing procedure.

The training sequence is a digital sequence generated by a sequence generator. The training sequence can be well designed with random numbers but equally distributed 1s and 0s. The training sequence is a known digital sequence to the memory system, and can be concatenated with the user data as the read data. Since the training sequence and the user data can be stored under same condition and in the same location of the memory devices, the characters of the training sequence and the user data can be same or very similar. Since the training sequence is a known sequence, by analyzing the training sequence, the characters of the read data including the user data can be retrieved.

With single read or multiple reads of the read data, the training sequence can be analyzed. The characters of the training sequence and the user data can be easily understood. In accordance with the characters of the read data, the optimal threshold voltages Vt can be distinguished and precisely identified to fully utilize the ECC engine. Therefore, a fast and simple mechanism to obtain a precise optimal threshold voltage can achieve the ultimate goal of making Nand more reliable, or guarantee the read data is decodable. The precise optimal threshold voltage can result in improvement of the memory system performance and reduction of power consumption.

FIG. 1 is a top-level block diagram schematically illustrating a semiconductor memory system in accordance with an embodiment of the present invention. Referring FIG. 1, the memory system 10 may include a memory controller 100 and a memory device 200. The memory controller 100 may control overall operations of the memory device 200.

The memory device 200 may perform one or more erase, program, and read operations under the control of the memory controller 100, wherein the memory controller may include an embedded processor 102, a sequence generator such as a training sequence generator 104 for generating training sequences/known sequences, and a sequence analyser such as a training sequence analyzer 106 for analyzing the training sequences. The training sequence generator 104 and training sequence analyzer 106 can be located in the controller 100. Optionally, the training sequence generator 104 and training sequence analyzer 106 can be located outside the controller 100. When the training sequence generator 104 and training sequence analyzer 106 located externally to the controller 100, updating of the generated training sequences may need to be provided to the controller 100, such that the training sequences are known to the controller 100. Detailed descriptions of the training sequence generator 104 and the training sequence analyzer 106 can be found in the embodiments of the present invention.

The memory device 200 may receive a command CMD, an address ADDR and data through input/output lines. The memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the memory device 200 may be integrated in a single semiconductor device. For example, the memory controller 100 and the memory device 200 may be integrated in a single semiconductor device such as a SSD. The SSD may include a storage device for storing data therein. When the memory system 10 is used in an SSD, operation speed of a host (not shown) coupled to the memory system 10 may remarkably improve.

The memory controller 100 and the memory device 200 may be integrated in a single semiconductor device such as a memory card. For example, the memory controller 100 and the memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (micro MMC), a secure digital (SD) card, a mini secure digital (mini SD) card, a micro secure digital (micro SD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data centre, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
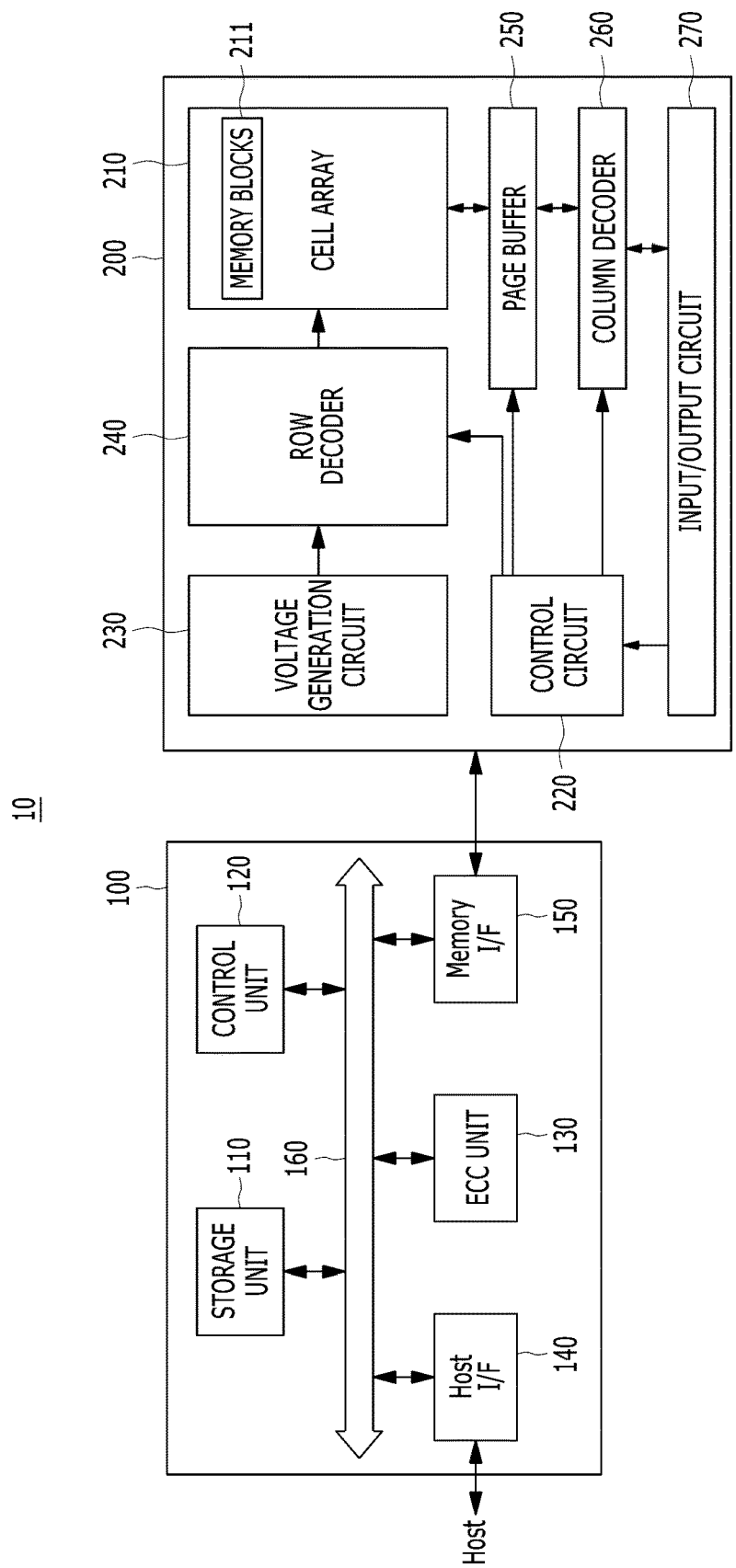
FIG. 2 is a detailed block diagram illustrating a semiconductor memory system in accordance with an embodiment of the present invention.

FIG. 2 is a detailed block diagram illustrating a semiconductor memory system in accordance with an embodiment of the present invention. For example, the semiconductor memory system of FIG. 2 may depict the memory system 10 shown in FIG. 1.

Referring to FIG. 2, the memory system 10 may include the memory controller 100 and the memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magneto-resistive RAM (MRAM) and a resistive RAM (RRAM).

The memory controller 100 may control storage of data in the memory device 200. For example, the memory controller 100 may control the memory device 200 in response to a request from the host device. The memory controller 100 may provide the data read from the memory device 200, to the host device, and store the data provided from the host device into the memory device 200.

The memory controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the memory controller 100, and store data for driving the memory system 10 and the memory controller 100. When the memory controller 100 controls operations of the memory device 200, the storage unit 110 may store data used by the memory controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the memory controller 100 and the memory device 200 to allow the memory controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
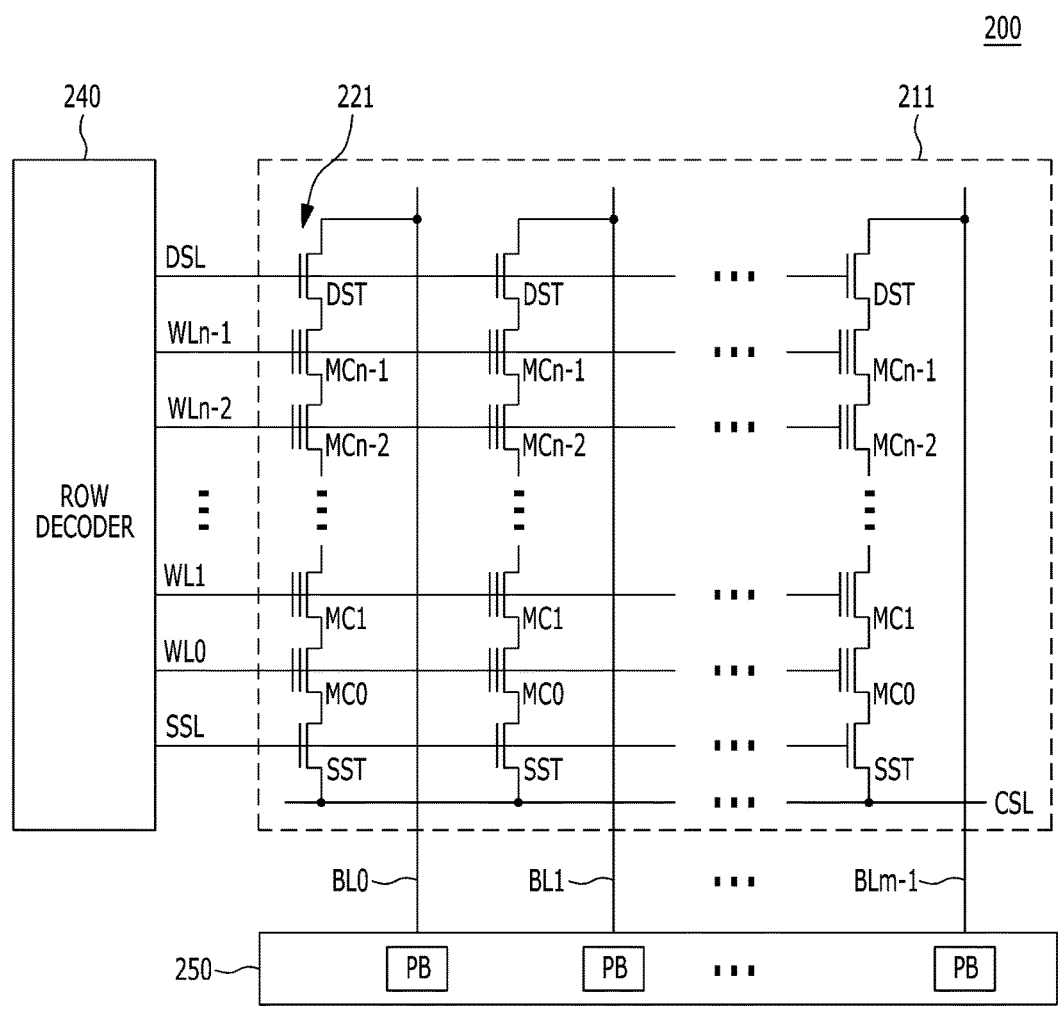
FIG. 3 is a circuit diagram illustrating a memory block of semiconductor memory devices in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory device 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
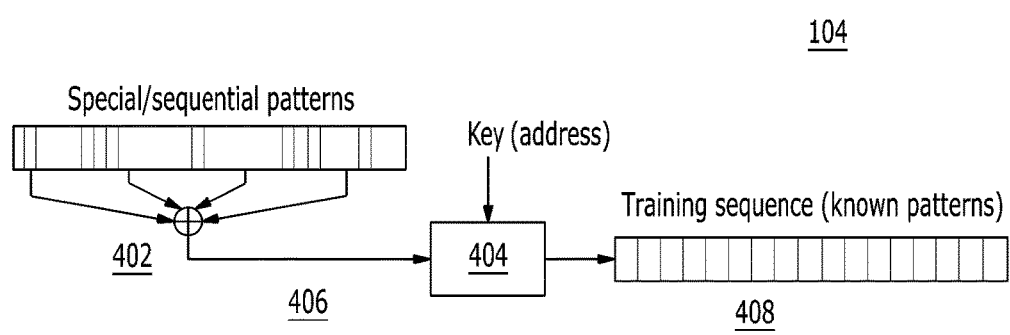
FIG. 4 is a block diagram schematically illustrating a training sequence generator of a semiconductor memory system in accordance with an embodiment of the present invention.

FIG. 4 is a block diagram schematically illustrating a training sequence generator of a semiconductor memory system in accordance with an embodiment of the present invention. The training sequence generator 104 of FIG. 1 can comprise a pattern generator 402 and a scrambler 404.

The pattern generator 402 can have a plurality of inputs of special or sequential patterns, such as "10", "11", "01", or "00". The pattern generator 402 can select at least one of the plurality of special patterns in accordance with configurations of the memory system. The selected patterns can be processed in various ways to create an initial sequence 406, including simply concatenating the patterns together or utilizing other algorithms. The number of the selected special patterns can be various in accordance with the semiconductor memory system configurations, particularly with the length of the user data, performance request of the threshold voltages, or the memory space restrictions. The length of the initial sequence can be various in accordance with a threshold voltage accuracy request of the semiconductor memory system and performance request of the memory system.

Typically, a longer sequence can be desirable for more accurate character analysis results. If the memory system has a lower failed bit rate, the length of the sequences can be shorter since the threshold voltages may be more accurate already. If the memory system has more noises, a longer sequence may be needed for more accurately identifying the optimal threshold voltages. However, since the training sequences are stored in the memory cell along with the corresponding user data, some memory spaces need to be reserved for the training sequence, resulting in reduction of memory spaces for storing the user data. Thus, the length of the training sequences can be configured in accordance with the budget of the memory system, although longer sequence is more desirable for higher accuracy. Typically, the length of the sequence can be 1024 bits or longer.

The same initial sequence 406 can be applied to the entire memory pages and blocks. Alternatively, the initial sequence 406 can be different for individual memory pages or blocks. Regardless the initial sequence 406 is same or different for individual memory pages or blocks, the number of 1s and 0s in the initial sequence 406 can be balanced, such as equal numbers of 1s and 0s. The initial sequence 406 can be forwarded to the scrambler 404 and to be scrambled with a key or address. The scrambled initial sequence can be output as a known sequence or training sequence 408. The key can be a scramble seed from the address of the read data, wherein the training sequence 408 is appended there with. The scrambler 404 can be utilized to customize the initial training sequence 406 associated with the specific address and makes the sequence having evenly distributed 0s and 1s, for minimizing the damages caused by the same sequence pattern with uneven distribution of 0s and 1s. After scrambled, the training sequence 408 is unique with the key for individual user data or address thereof. The scrambled sequences can prevent damaging the memory device due to repeating writing the same patterns to the same location.

Occasionally, utilization of the scrambler 404 only cannot achieve a good sequence with evenly distributed 0s and 1s. Thus, the special sequential patterns may be used to cover all the thresholds. The special sequential patterns can also be well-designed and used to provide satisfied 1s and 0s distribution since limited or short sequences can't provide evenly distributed 1s and 0s. When the budget is tight, the special sequential patterns can be utilized because the coverage of 1s and 0s distribution is limited.

In order to append the training sequence 408 to the user data, the training sequence generator 104 can be designed to achieve randomized and evenly distributed 0s and 1s. The semiconductor memory system knows the digital data in the generated training sequence 408 exactly. Thus, the generated training sequence 408 can be called known sequence alternatively.

It has been found that an evenly distributed and randomized training sequence can provide more accurate information for analysis the training sequence, resulting in more accurately understanding the characters of the data and identifying the threshold voltage more precisely and quickly.

Figure 5:
FIG. 5 is a diagram illustrating training sequence of a semiconductor memory system in accordance with an embodiment of the present invention.

FIG. 5 is a diagram illustrating training sequence of a semiconductor memory system in accordance with an embodiment of the present invention. The training sequence 408 of FIG. 4 generated by the training sequence generator 104 of FIG. 1 can be written to the memory devices along with the user data associated therewith. The position of the training sequence can be various, such as in front of the user data, in the middle of the user data, or after the user data. For example, the training sequence can be inserted in front of the user data as shown in FIG. 5.

The purpose of writing the training sequence with the user data is to locate the training sequence to the part of memory area where the user data to be read. The characters of the training sequence are same or very similar to the user data, since both the training sequence and the user data are read out from the same location of the memory devices. Because the training sequence is known sequence, by analyzing the training sequence, the characters of the user data can be understood as well. In accordance with the characters of the user data, quick distinguishing of all optimal threshold voltages Vt can be achieved, for single-bit memory cells or multi-bit memory cells. The correlation among the characters of the user data, the training sequence, and the optimal threshold voltages maybe strong and predetermined in a pre-process and stored in the memory system.

Figure 6:
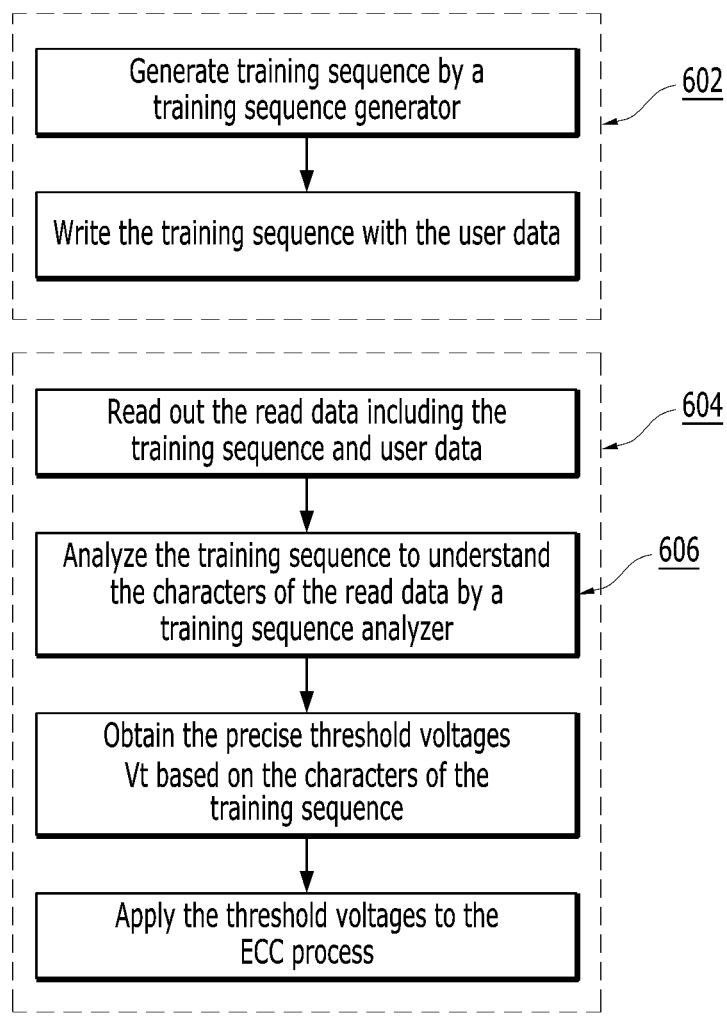
FIG. 6 is a flowchart illustrating training sequence procedure of a semiconductor memory system in accordance with an embodiment of the present invention.

FIG. 6 is a flowchart illustrating training sequence procedure of a semiconductor memory system in accordance with an embodiment of the present invention. The training sequence procedure 600 can include a training sequence generating module 602 and a training sequence analyzing module 604.

The training sequence can be generated by the training sequence generator 104, and be written to the memory devices 200 along with the user data following the write instructions sent from the memory controller 100 of FIG. 1. The training sequence generator 104 can create the training sequence to be attached to the user data in accordance with the requests and configuration of the memory system. The whole data including the user data and the training sequence can be sent to the Nand and can be read back to the memory controller 100 to analyze the characters of the data, specifically to the training sequence analyzer 106 of FIG. 1.

The training sequence analyzing module 604 can read out the whole data/read data from the memory devices 200 following the read instruction sent from the memory controller 100, wherein the read data can comprise the training sequence and the associated user data. The position of the training sequence can be various but predetermined. The training sequence can be located from the read data for analysis by the training sequence analyzer 106.

The training data then can be analyzed to understand the characters of the read data by a training sequence analyzer 606. Since the training sequence is known sequence to the memory system, the training sequence read out from the memory devices can be analyzed and compared with the sequence known to the memory system. The analysis results can be used to understand the characters of the read data and identify the optimal threshold voltages precisely.

Based on the precise threshold voltages Vt, the ECC can be utilized more effectively with dramatically reduced iterations of tries and errors, with understanding the characters of the user data. The performance and reliability of the semiconductor memory system can be improved dramatically, because of shorter ECC process time and accurate ECC encoding/decoding.

Figure 7:
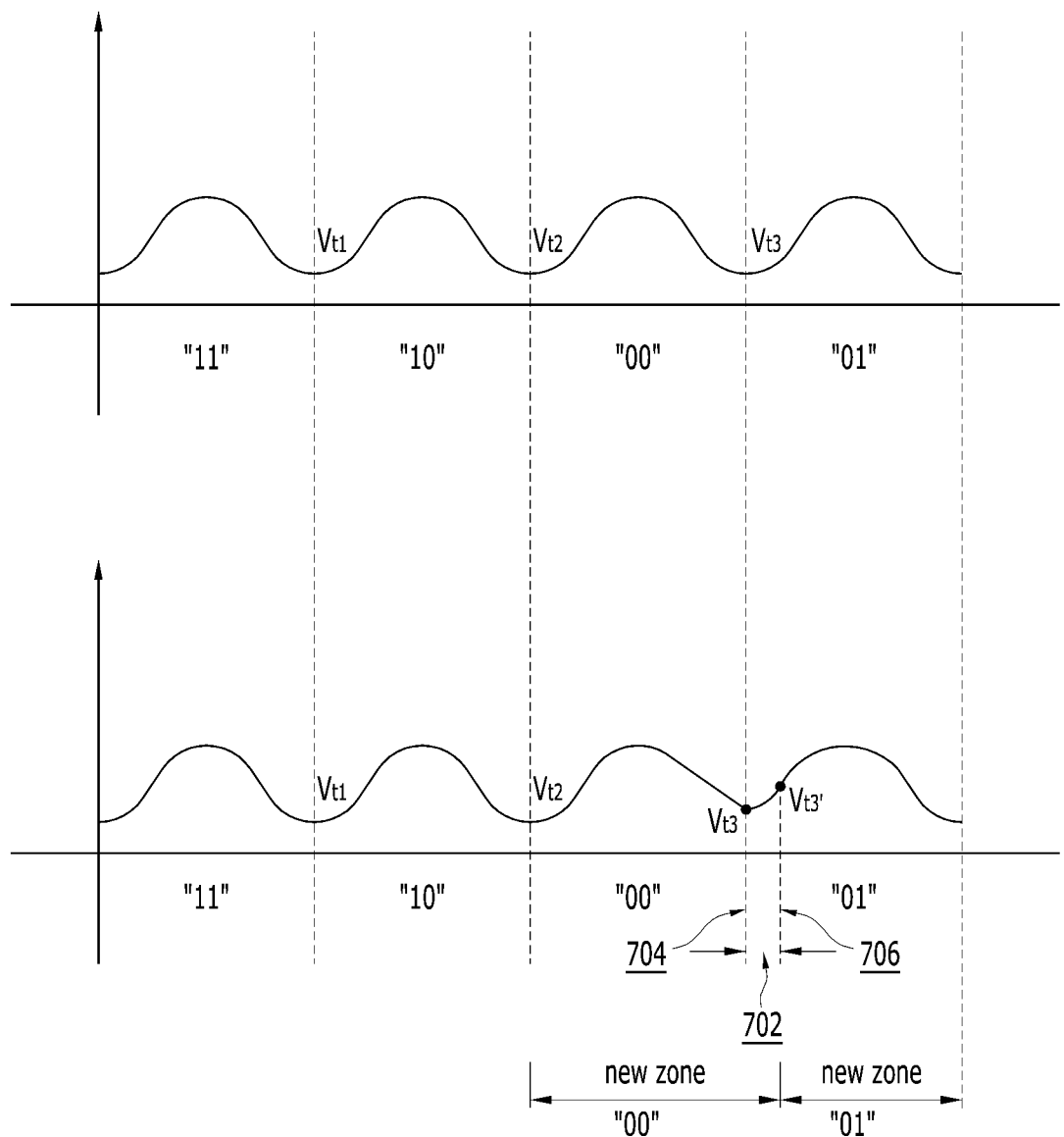
FIG. 7 is a diagram illustrating a scenario of a training sequence for identifying characters in an embodiment of the present invention.

FIG. 7 is a diagram illustrating a scenario of a training sequence for identifying characters in an embodiment of the present invention. The length and pattern of the training sequence can be various, the following scenario uses an 8-bit sequence as an example for describing the procedure, while the real sequence can be different.

For example, an 8-bit training sequence is generated and written to the MLC memory devices along with a user data, such as "11100001". The 8-bit training sequence is known to the memory system and is written in front of the user data in the memory devices. When the read data is read out from the memory devices, the read data can include the 8-bit training sequence and the associated user data. The training sequence can be located from the read data for analysis. The 8-bit training sequence can be analyzed and compared with the known sequence.

The 8-bit training sequence comprises 4 ones and 4 zeros, and divided into 4 ideal zones, such as zone "11", zone "10", zone "00", and zone "01". The multiple threshold voltages can be used as boundaries between the adjacent zones, such as Vt1, Vt2, or Vt3. When the threshold voltages are appropriate, the training sequence can be read out as "11100001", without any errors. However, in reality, the read-out sequence read out from the memory pages may be different than the known sequence due to noises or memory device aging. The analysis results of the read-out sequence may have mismatches than the known sequence, such that the read-out sequence may be read out as "11100101". In this scenario, the threshold voltage Vt3 separating the zone "00" and zone "01" is shifted into the zone "01". A portion of the ideal zone "00" is extended into the zone "01". When the read-out sequence is read out from a shifted area 702, a sub-sequence of "00" may be read out as "01" since the sub-sequence of "00" fell into the zone "01". By comparing the know sequence of "11100001" and the read-out sequence of "11100101", the characters of the user data can be understood by the analysis results of the read-out sequence. Since the boundary of the zone "00" and zone "01" is not appropriate, an adjustment can be determined and applied to the Vt3 for an optimal threshold voltage Vt3'. In this scenario, the Vt3 may be increased to Vt3' for adjusting a boundary 704 for an appropriate position of new boundary 706 for separating new zone "01" and new zone "00". Since the shifted area 702 is now in the new zone "00", the data read-out from the shifted area 702 can be correctly identified as "00" instead of being mistaken as "01". The original zone "00" and zone "01" can be adjusted to the new zone "00" and the new zone "01" as shown in FIG. 7.

After the adjustment is applied to the Vt3, a new threshold voltage Vt3' can be used as the boundary separating the new zone "00" and new zone "01". A subsequent read can be conducted with the new threshold voltage of Vt3'. A subsequent read-out sequence analysis can be performed and subsequent adjustment can be applied to Vt3' or other threshold voltages in accordance with the new analysis results. The iterations of character analysis and threshold voltage adjustment can be performed repeatedly until the desirable results are reached. The final optimal threshold voltages can be identified and adapted by the ECC for further procedure.

For MLC memory system, multiple threshold voltages can be subject to adjustments based on the analysis results. For example, one or more of the threshold voltages Vt1, Vt2, or Vt3 can be adjusted in the same iteration simultaneously with same or different adjustment amounts in accordance with the analysis results, respectively. The one or more of threshold voltages in the subsequent iteration can be analyzed and adjusted in accordance with subsequent read-out data and analysis results.

The amount of adjustment can be determined in accordance with the character analysis results. When the character analysis results show a server deviation from the known sequence, a large adjustment amount may be applied to the threshold voltage, while a small adjustment amount may be applied in accordance with a smaller deviation. The minimum adjustment amount or minimum step that can be applied for adjustment can be predetermined by the manufacture of the memory system.

In the above scenarios, the optimal threshold voltages can be identified precisely in accordance with the analysis results. The optimal threshold voltages can be identified in accordance with various factors, such as the patterns of failed bits.

The length of the training sequence can also contribute to the accuracy of identifying the optimal threshold voltage, since a longer training sequence can provide more information so that the optimal threshold voltages can be identified more accurately. Typically, a longer training sequence can satisfy a higher accuracy request, and can reduce the number of iterations for searching the optimal threshold voltages. Other factors can also contribute for identifying optimal threshold voltages more precisely.

Figure 8:
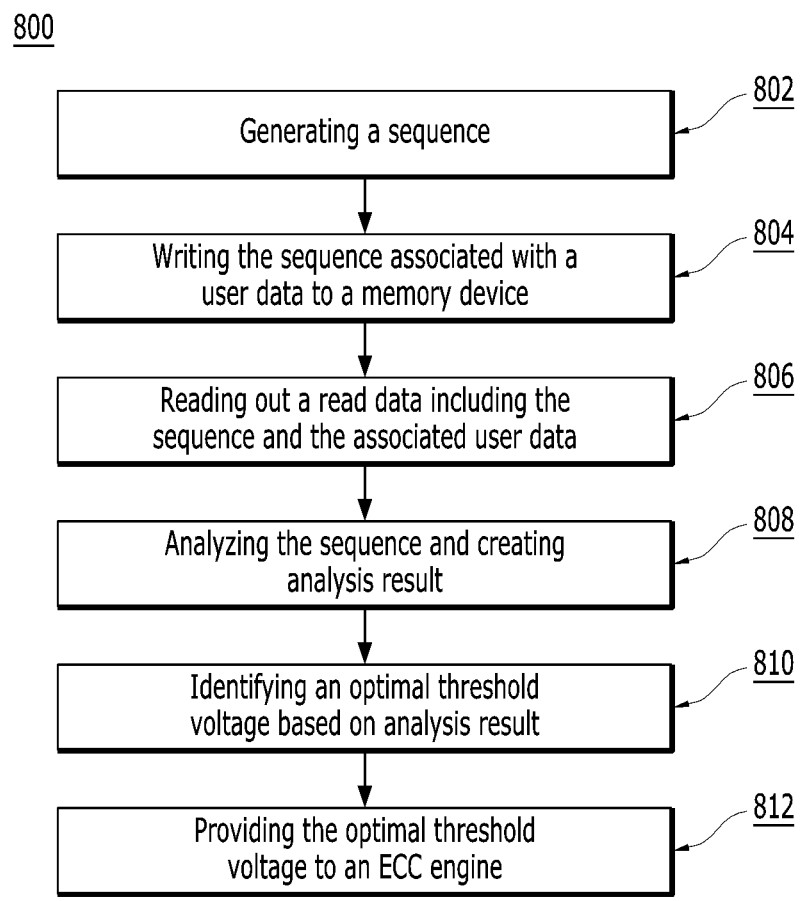
FIG. 8 is a flowchart illustrating operating method of a memory system in a further embodiment of the present invention.

FIG. 8 is a flowchart illustrating operating method of a memory system in a further embodiment of the present invention. The flowchart 800 includes generating a sequence by a sequence generator in a block of 802, wherein the sequence comprises a sequence of digital data; writing the sequence associated with a user data to a memory device in a block of 804; reading out a read data including the sequence and the associated user data in a block of 806; analyzing the sequence to understand characters of the read data and creating analysis result by a sequence analyzer in a block of 808; identifying an optimal threshold voltage in accordance with the analysis result in a block of 810; and providing the optimal threshold voltage to an ECC engine in a block of 812.

The mechanism of understanding the characters of memory system described in the embodiments of the present invention, can be utilized not only to identify the precise optimal threshold voltages, but also can be used in other applications, wherein the other application can be optimized in accordance with the characters of the memory system, especially the characters of the memory pages. Occasionally, the characters can be fed back to manufactures, so that the manufactures can utilize character information to optimize the memory system, such as improvement of the ECC algorithm.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A semiconductor memory system comprising:
  a memory device; and
  a memory controller including a sequence generator, a sequence analyzer, and a processor, the memory controller being coupled to the memory device and containing instructions for execution by the processor to
  generate a training sequence, using the sequence generator, for analysis of user data, wherein the training sequence comprises a sequence of digital data that is randomly generated, has a length indicative of a level of accuracy of analysis and is known to the memory system,
  write the training sequence with the associated user data to the memory device,
  read out the training sequence and the associated user data,
  analyze the training sequence, using the sequence analyzer, to understand characters of the user data and create an analysis result,
  identify an optimal threshold voltage in accordance with the analysis result, and
  use the optimal threshold voltage in an error correction coding process.

2. The system of claim 1 wherein the training sequence is generated in accordance with configuration of the memory system.

3. The system of claim 1 wherein the randomly generated training sequence is evenly distributed with zeros and ones.

4. The system of claim 1 wherein the optimal threshold voltage includes multiple optimal threshold voltages when the memory system is a multi-level cell (MLC) memory system.

5. The system of claim 1 wherein the sequence generator includes a scrambler scrambling inputs thereof with a key or address.

6. The system of claim 1 wherein the sequence generator receives as inputs patterns from which the training sequence is generated.

7. The system of claim 1 wherein the training sequence is written in front of, in the middle of, or after the associated user data therewith.

8. The system of claim 1 wherein the sequence analyzer analyzing the training sequence includes comparing the sequence read out from the memory device with the training sequence generated by the sequence generator.

9. The system of claim 1 wherein the memory controller configured to identify the optimal threshold voltage includes identifying at least one threshold voltage to be adjusted and applying an appropriate voltage amount thereto.

10. The system of claim 9 wherein the memory controller configured to identify the optimal threshold voltage includes conducting at least one identifying and adjusting iterations until reaching desired results.

11. A method of operating a semiconductor memory system comprising:
generating a training sequence by a sequence generator, for analysis of user data, wherein the training sequence comprises a sequence of digital data that is randomly generated, has a length indicative of a level of accuracy of analysis and is known to the memory system;
writing the training sequence with the associated user data to a memory device;
reading out the training sequence and the associated user data;
analyzing the training sequence, using a sequence analyzer, to understand characters of the user data and creating an analysis result;
identifying an optimal threshold voltage in accordance with the analysis result; and
using the optimal threshold voltage in an error correction coding process.

12. The method of claim 11 wherein the training sequence is generated in accordance with an accuracy request of the memory system.

13. The method of claim 11 wherein the randomly generated training sequence is evenly distributed with zeros and ones.

14. The method of claim 11 wherein the identifying the optimal threshold voltage includes identifying multiple optimal threshold voltages when the memory system is a multi-level cell (MLC) memory system.

15. The method of claim 11 wherein the generating the training sequence includes generating the training sequence with a scrambler scrambling inputs thereof with a key or address.

16. The method of claim 11 wherein the generating the training sequence includes generating the training sequence by processing inputs of patterns.

17. The method of claim 11 wherein the writing the training sequence associated with a user data includes writing the training sequence in front of, in the middle of, or after the associated user data therewith.

18. The method of claim 11 wherein the analyzing the training sequence includes comparing the sequence read out from the memory device with the training sequence generated by the sequence generator.

19. The method of claim 11 wherein the identifying the optimal threshold voltage includes identifying at least one threshold voltage to be adjusted and applying an appropriate voltage amount thereto.

20. The method of claim 19 wherein the identifying the optimal threshold voltage includes conducting at least one identifying and adjusting iterations until reaching desired results.

* * * * *